(12) United States Patent
Reichel

(10) Patent No.: US 8,400,165 B2
(45) Date of Patent: Mar. 19, 2013

(54) POWER CALIBRATION SYSTEM

(75) Inventor: Thomas Reichel, Baldham (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 270 days.

(21) Appl. No.: 12/956,783

(22) Filed: Nov. 30, 2010

(65) Prior Publication Data
US 2011/0169502 A1    Jul. 14, 2011

(30) Foreign Application Priority Data

Jan. 12, 2010 (DE) .......................... 10 2010 004 392
Apr. 23, 2010 (DE) .......................... 10 2010 018 026
Jul. 9, 2010 (DE) .......................... 10 2010 026 630

(51) Int. Cl.
*G01R 35/00* (2006.01)

(52) U.S. Cl. ......................................... 324/601; 702/85

(58) Field of Classification Search .................. 324/601, 324/600, 74, 130, 202, 750.02; 702/85; 340/501, 340/870.04
See application file for complete search history.

(56) References Cited

U.S. PATENT DOCUMENTS

| | | | |
|---|---|---|---|
| 4,680,538 A * | 7/1987 | Dalman et al. ................. | 324/638 |
| 5,204,614 A | 4/1993 | Szente et al. | |
| 6,803,754 B2 * | 10/2004 | Bratfisch et al. ................. | 324/95 |
| 7,652,484 B2 * | 1/2010 | Wong et al. .................... | 324/601 |
| 2001/0009374 A1 | 7/2001 | Yagi | |
| 2008/0143343 A1 | 2/2008 | Chen et al. | |
| 2008/0204039 A1 * | 8/2008 | Wong et al. .................... | 324/601 |
| 2011/0187345 A1 * | 8/2011 | Karnik ............................ | 324/74 |

FOREIGN PATENT DOCUMENTS

| | | |
|---|---|---|
| DE | 69214063 T2 | 2/1997 |
| DE | 69222000 T2 | 1/1998 |
| DE | 102005005887 A1 | 8/2006 |

OTHER PUBLICATIONS

Burns, "Vector Analyzer Speeds Power-Sensor Calibration Results", Microwaves & RF, 26:91-96 (Aug. 1987).

* cited by examiner

*Primary Examiner* — Hoai-An D Nguyen
(74) *Attorney, Agent, or Firm* — Marshall, Gerstein & Borun LLP

(57) ABSTRACT

A calibration system for calibrating power sensors includes a signal generator, a first signal splitter, a second signal splitter, a third signal splitter, a first measuring point, a second measuring point, a test port and a first power sensor. In this context, the signal generator is connected to the input of the first signal splitter. A first output of the first signal splitter is connected to the second signal splitter. A first output of the second signal splitter is connected to the test port. A second output of the second signal splitter is connected to the first measuring point. A second output of the first signal splitter is connected to the third signal splitter. A first output of the third signal splitter is connected to the first power sensor. A second output of the third signal splitter is connected to the second measuring point.

15 Claims, 8 Drawing Sheets

POWER CALIBRATION SYSTEM

CROSS-REFERENCE TO RELATED APPLICATIONS

The present application claims priority to German Applications DE 10 2010 004 392.3 filed Jan. 12, 2010, DE 10 2010 018 026.2 filed Apr. 23, 2010, and DE 10 2010 026 630.2 filed Jul. 9, 2010, the entire respective disclosures of which are incorporated herein by reference.

BACKGROUND OF THE INVENTION

1. Field of the Invention

The invention relates to a system for calibrating power sensors.

2. Related Technology

The calibration of power sensors for the high-frequency and microwave range is generally implemented through power comparison at a well-matched source. In this context, the sensor to be calibrated and a reference sensor are connected in succession to a signal source. From the ratio between the two measured powers, a correction factor for the device under test is obtained. However, a disadvantage here is that measuring errors occur as a result of mismatching. This results in imprecise calibration results.

For the compensation of the measuring errors resulting from incorrect matching, the use of vectorial network analyzers is also known. Accordingly, the document "The Vector Analyzer Speeds Power-Sensor Calibration Results", Microwaves & RF, August 1987, discloses the subdivision of the output signal of a signal generator by means of a resistive power splitter. In this context, one branch of the power splitter is connected to an internal reference power sensor. A second branch of the power splitter is connected via a double directional coupler to the test port for a power comparison. The power sensor to be investigated and a reference power sensor are connected in succession to the test port. The coupling branches of the double directional coupler here are connected to a vectorial analyzer for mismatch compensation.

A disadvantage here is that no optimal matching is achieved and accordingly imprecise measuring results are still obtained.

SUMMARY OF THE INVENTION

The invention provides a calibration system for power sensors that achieves a very high calibration accuracy. Accordingly, the invention provides a calibration system and a method for power calibration and measurement of the source-port matching by the inventive calibration system.

The calibration system according to the invention and the method for power calibration and source-port matching according to the invention are based upon the recognition that for an optimal matching and thus for a trouble-free calibration, an identity is required between the reflection coefficient $\gamma_{eq}$ and the source-port matching $e_s$ of the network analyzer. If this is guaranteed, no interference from reflections occurs.

Furthermore, the invention uses impedance values obtained within the framework of a measurement of the source-port matching of the network analyzer for the correction of a power calibration. A very simple and timesaving power calibration is achieved in this manner.

A calibration system according to the invention for calibrating power sensors provides a signal generator, a first signal splitter, a second signal splitter, a third signal splitter, a first measuring point, a second measuring point, a test port, and a first power sensor. The signal generator in this context is connected to an input of the first signal splitter. A first output of the first signal splitter is connected to the second signal splitter. A first output of the second signal splitter is connected to the test port. A second output of the second signal splitter is connected to the first measuring point. A second output of the first signal splitter is connected to the third signal splitter. A first output of the third signal splitter is connected to the first power sensor. A second output of the third signal splitter is connected to the second measuring point. A favorable matching with the test port can be achieved in this manner.

A method for power calibration and measurement of the source-port matching by the inventive calibration system comprises using an impedance value obtained through a measurement of the source-port matching for a correction of a power calibration.

BRIEF DESCRIPTION OF THE DRAWINGS

The invention is described below by way of example with reference to the drawings, in which an advantageous exemplary embodiment of the invention is presented. The drawings are as follows.

DETAILED DESCRIPTION

The structure and functioning of exemplary calibration systems for power sensors will initially be described with reference to FIGS. 1-4. On this basis, the problems upon which the invention is based will be explained. With reference to FIGS. 5-8, the structure and functioning of various forms of the calibration system according to the invention are then shown. In some cases, the presentation and description of identical elements in similar drawings has not been repeated.

Figure 1:
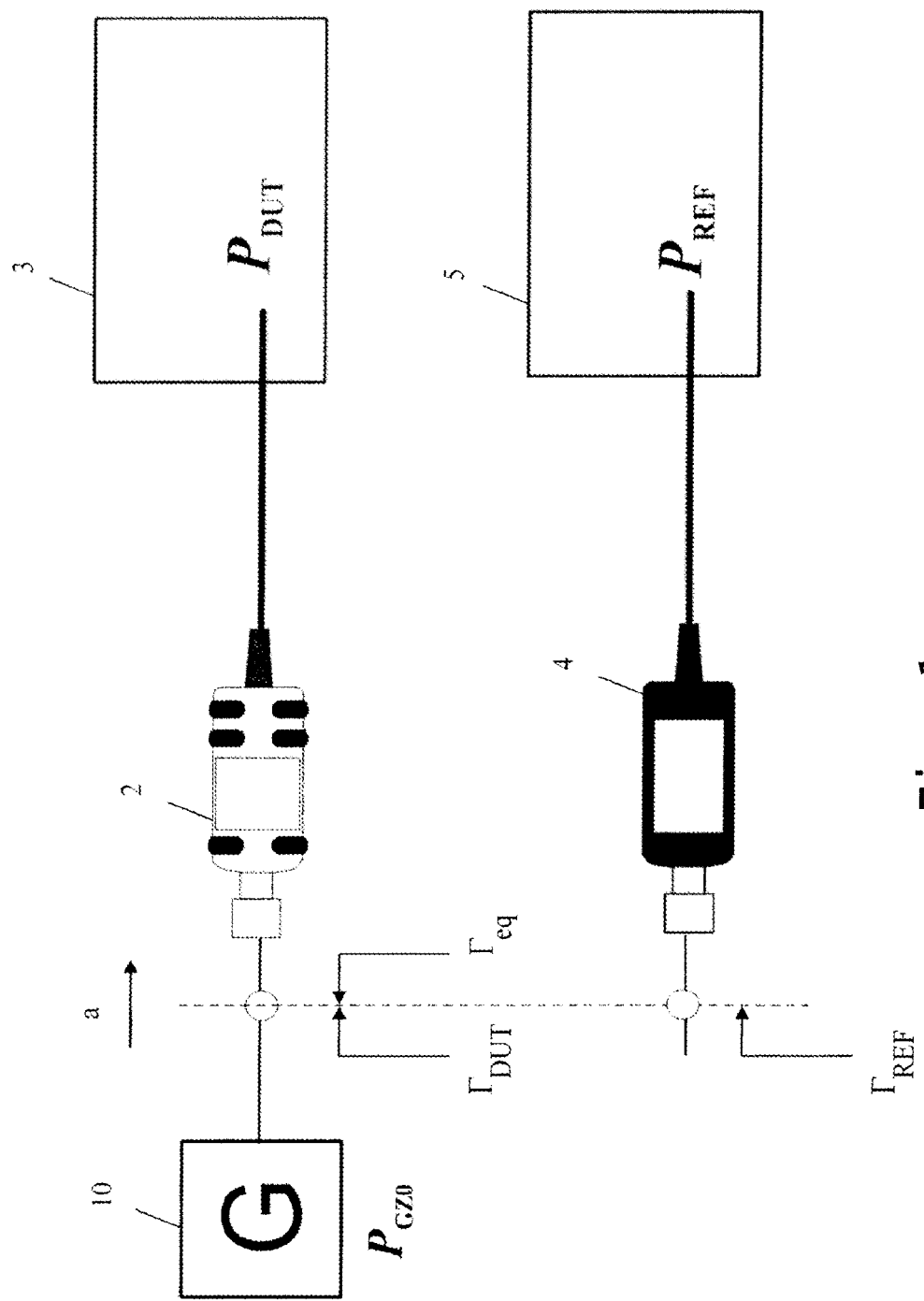
FIG. 1 shows a first exemplary calibration system.

FIG. 1 shows a first exemplary calibration system. A signal generator 10 is connected in succession to a reference power sensor 4 and to a power sensor 2 to be calibrated. The sensors 2, 4 in this context are connected in each case to a respective power meter 3, 5. The signal generator 10 outputs power $P_{GZ0}$ with surge-impedance corrected matching. At the test port of the signal generator 10, a signal a is output respectively to the power sensor 2 to be calibrated and to the reference power sensor 4. The power sensors 2, 4 in conjunction with the power meters 3, 5 convert the power of the signal a into measured power values $P_{DUT}$ and respectively $P_{REF}$. The power of the signal is measured by the power meters 3, 5. A correction factor is determined from the ratio of the measured power values.

In this context, the power comparison is impaired by various effects, wherein the mismatching uncertainty represents the dominant influencing factor. Mismatching uncertainty always arises as a consequence of multiple reflections between the source and power sensor. When the reference power sensor 4 is connected, it causes the power $P_{REF}$ indicated by the latter to deviate somewhat from the rated power $P_{GZ0}$ of the source.

$$|a_{REF}|^2 = P_{REF} = \frac{P_{GZ0}}{|1 - \Gamma_{eq} \cdot \Gamma_{REF}|^2} \quad (1)$$

In an equivalent manner, after the DUT has been connected, the following applies $$|a_{DUT}|^2 = \frac{P_{DUT}}{K} = \frac{P_{GZ0}}{|1 - \Gamma_{eq} \cdot \Gamma_{DUT}|^2} \quad (2)$$

The following is obtained for the calibration factor:

$$K = \frac{P_{DUT}}{P_{REF}} \cdot \frac{|1 - \Gamma_{eq} \cdot \Gamma_{DUT}|^2}{|1 - \Gamma_{eq} \cdot \Gamma_{REF}|^2} \approx \frac{P_{DUT}}{P_{REF}} \quad (3)$$

To ensure that the calibration result is largely independent of the reflection behavior of the two power sensors 2, 4, multiple reflections must be prevented, that is, the signal source must absorb the signal components reflected from the sensors as completely as possible. Since this is guaranteed only with a good matching of the source ($\Gamma_{eq}$~0), conventional signal generators ($|\Gamma_{eq}|$~0.3) cannot generally be used as the calibration source without additional configuration.

Figure 2:
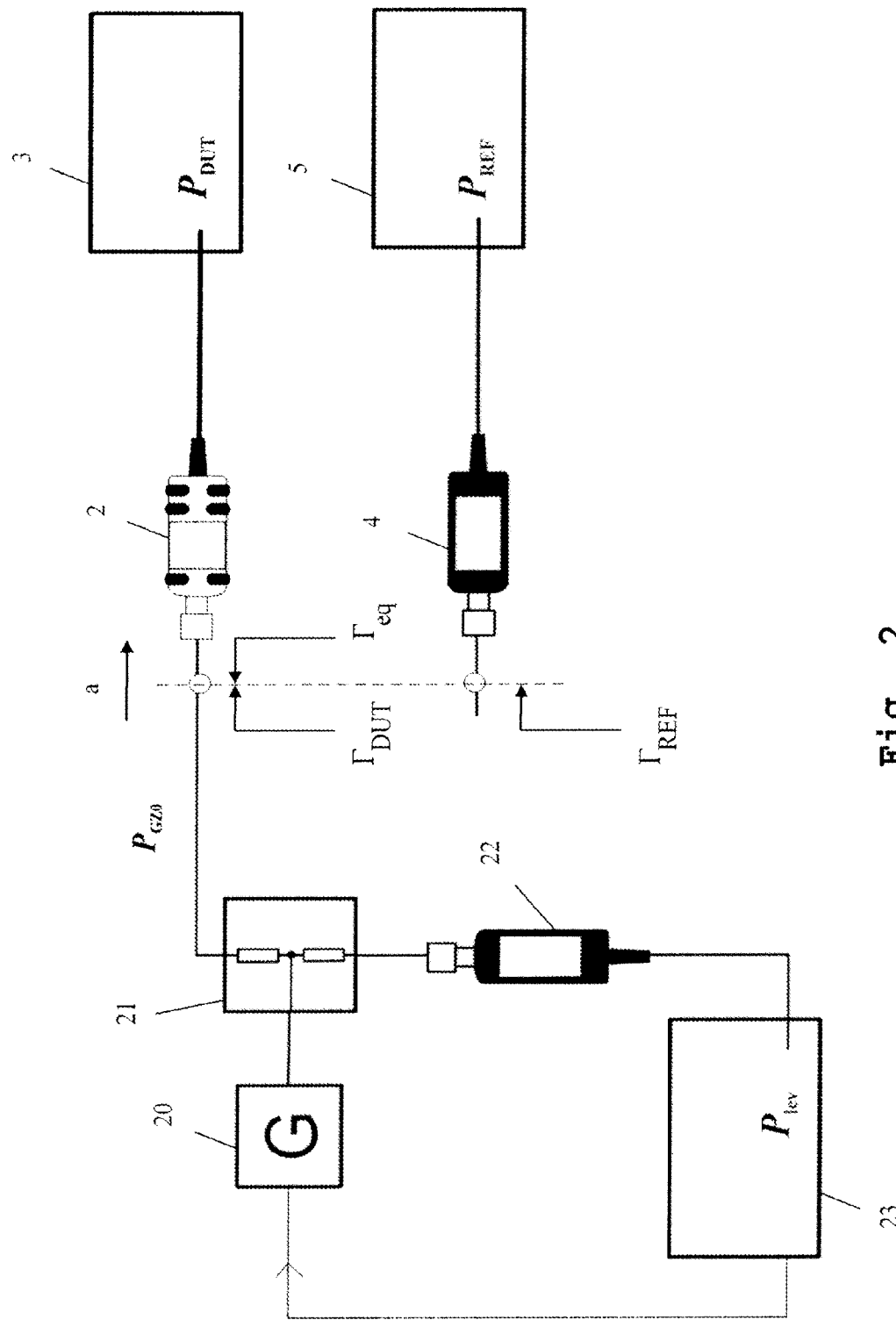
FIG. 2 shows a second exemplary calibration system.

FIG. 2 shows a second exemplary calibration system. In this context, instead of the simple signal generator 10 from FIG. 1, a regulated signal generator 20 is used. The signal generator 20 here is connected to a power splitter 21. The power splitter 21 used here is a resistive power splitter. It comprises a branching and two ohmic resistors. These resistors are of identical value. They are identical to the reference impedance. One of the resistors is arranged in each branch of the branching. All references made below to a power splitter refer to a power splitter (power splitter) of this kind. The output power of the signal generator 20 is guided here on the one hand to the test port of the calibration device. On the other hand, the power splitter 21 guides the signal to an internal power sensor 22, which is connected to an internal power meter 23. The internal power meter 23 is preferably connected to a control input of the signal generator 20.

The power splitter 21, the signal generator 20, the power sensor 22 and the power meter 23 in this context form a regulating loop. The regulating loop holds constant the input power for the power sensor 22 and accordingly the voltage at the connecting point of the two resistors. Accordingly, the power sensor connected to the test port is supplied from a well-matched source. In this manner, a satisfactory source-port matching ($|\Gamma_{eq}|\leq 0.1$) can be achieved.

Figure 3:
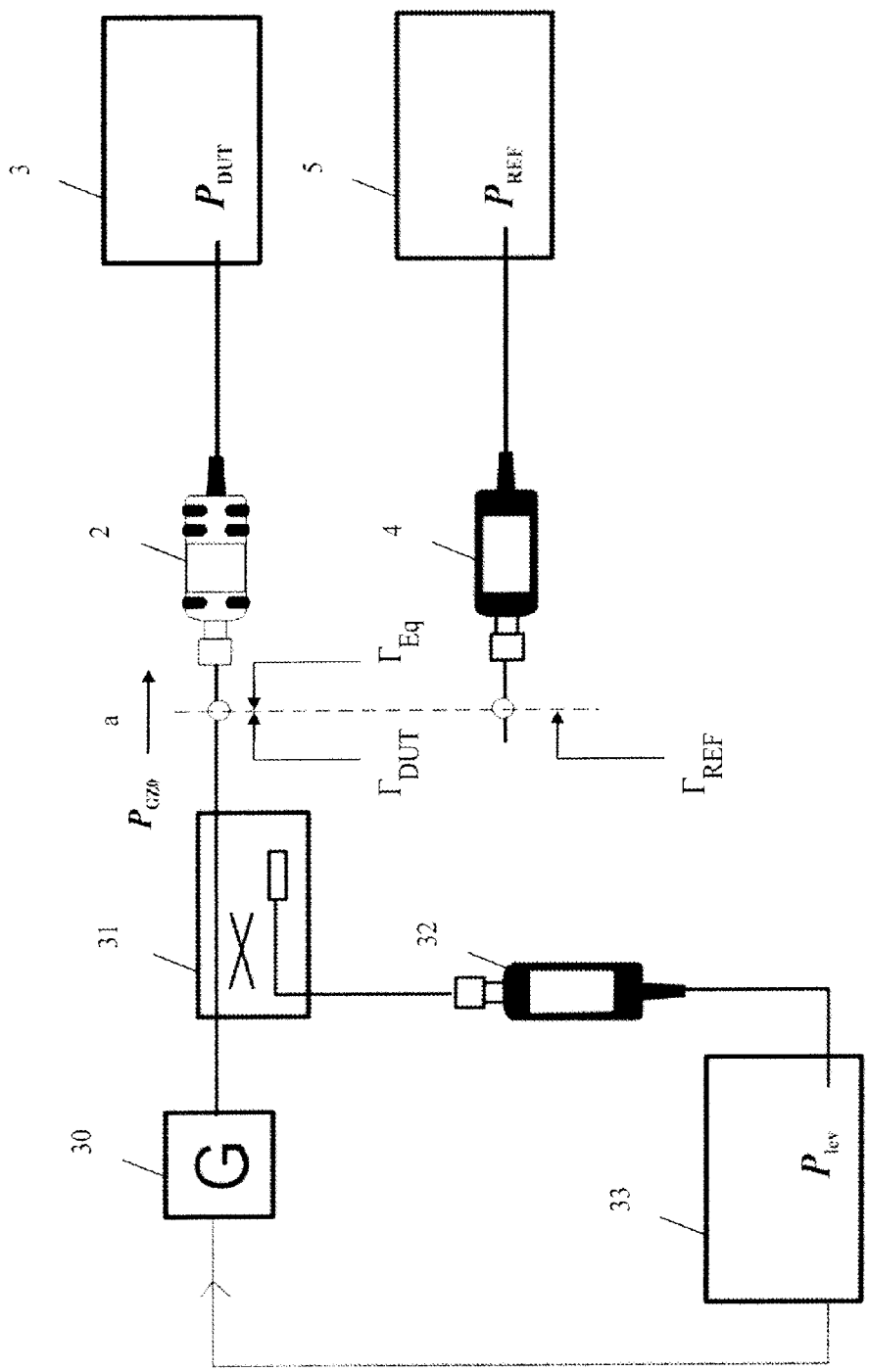
FIG. 3 shows a third exemplary calibration system.

Instead of a power splitter 21 as shown in FIG. 2, a well-matched directional coupler 31 of high directivity can also be used to subdivide the power of the signal generator 30. A configuration of this kind is shown in FIG. 3. The forward coupler 31 decouples a part of the output signal of the signal generator 30 and guides it forward to a power sensor 32. The latter is connected to a power meter 33, which is connected to the signal generator 30. As in FIG. 2, the signal generator, the power splitter 31, the power sensor 32 and the power meter 33 form a regulating loop. The function corresponds to the structure from FIG. 1 and FIG. 2 ($|\Gamma_{eq}|\leq 0.1$).

If the measured value of the internal power sensor 32 is provided not only as an analog adjustment value, but also as a numerical measured result, a frequency-dependent calibration factor can be determined for the calibration system in a first step (after the measurement with the reference power sensor 4). In the second step, the calibration system is used as a reference for the calibration of the device under test. This has the advantage that the power sensor required as a reference need only be connected in relatively large time intervals, and instead, the measured result of the power sensor 32 can be accessed in conjunction with the power sensor 22 from FIG. 2 is also possible.

With some designs, one further step is provided. Given an adequate linearity of all participating power sensors, the analog regulating loop is dispensed with and instead only a coarse stabilization of the output power is implemented on the basis of the numerical measured results of the power sensor 32.

In spite of the use of the illustrated power splitter or directional coupler, the power transfer in systems such as that described can still be associated with a significant loss of accuracy as a result of multiple reflections, albeit at a significantly lower level than with the use of a signal generator without supplementary configuration. This uncertainty can be reduced in a number of ways: through further reduction of the equivalent source-reflection coefficient using tuners, vectorial correction or hybrid forms. The method of vectorial correction (also known as gamma correction) involves a numerical compensation of those errors which result from multiple reflection. It is based on equation (3) and requires the complex reflection coefficients of the reference power sensor, of the power sensor under test and of the test port of the calibration system.

While the first two reflection coefficients can be determined using standard methods on vectorial network analyzers, the accurate determination of the complex test-port matching has remained an unresolved problem for some time. Accordingly, repeated attempts have been made worldwide to avoid this problem in such a manner that the vectorial network analyzer required anyway in the calibration of power sensors (for testing the matching) is included in the calibration system, and the source-port matching is then determined by network analyses with a standard calibration method.

Figure 4:
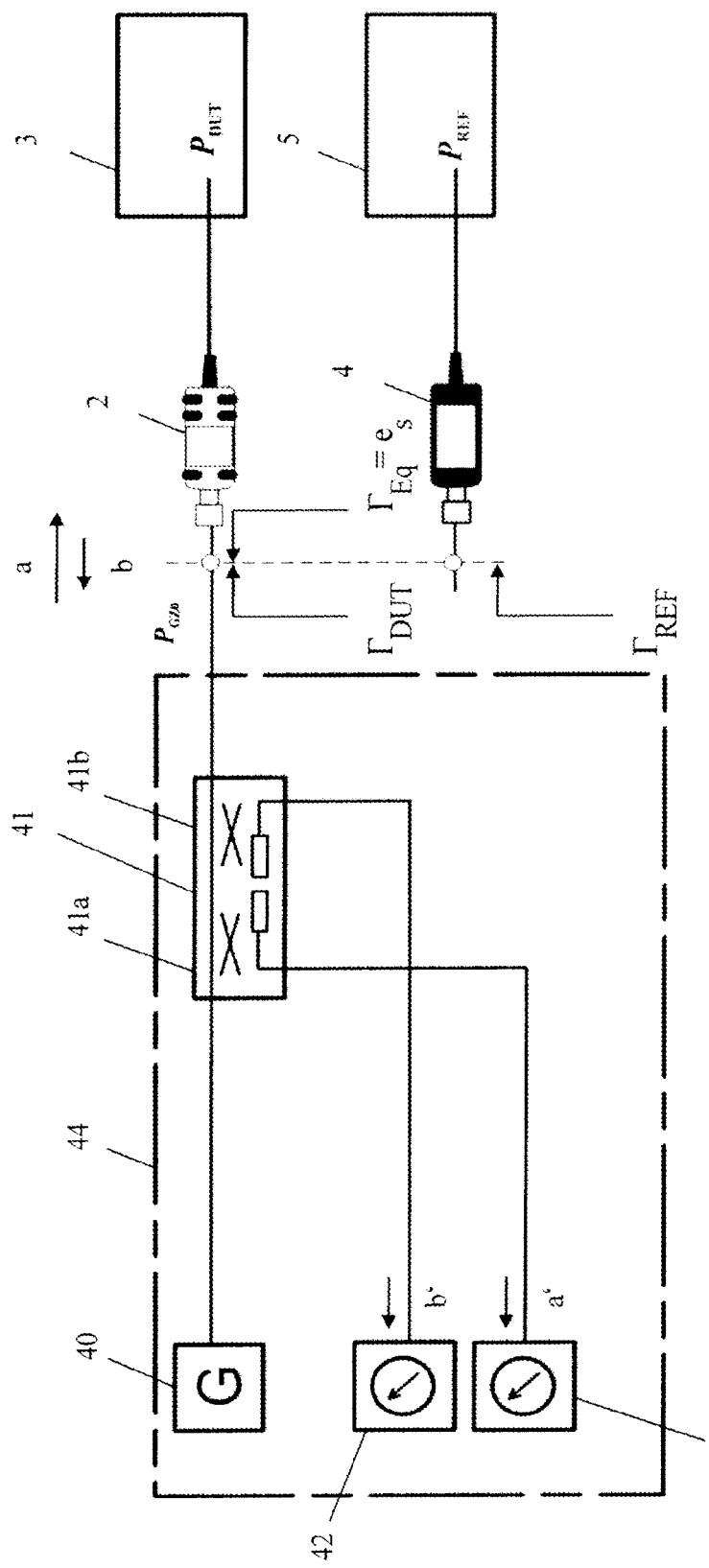
FIG. 4 shows a fourth exemplary calibration system.

In order to resolve the problem described above of mis-matching of the calibration system and respectively the sensors to be calibrated and the reference sensors, a vectorial network analyzer can be used as the calibration system. FIG. 4 shows a structure with a network analyzer, which, however, does not yet resolve the problem addressed. This vectorial network analyzer 44 contains a signal generator 40, a double directional coupler 41, which is composed of the two directional couplers 41a and 41b and two measuring points 42, 43. The directional coupler 41a reroutes a signal a', which corresponds largely to the signal output at the test port, to the measuring point 43. The directional coupler 41b reroutes a signal b', which corresponds to a signal b reflected respectively at the power sensor 2 to be calibrated or the reference power sensor 4, to the measuring point 42.

Since the decoupled waves are approximately proportional to the corresponding waves a and b at the test port, the impedance of the load at the test port can be calculated from the ratio b'/a'. For the power calibration, the power sensor 2 to be calibrated and the reference power sensor 4 are connected in succession to the test port, and the calibration factor for the device under test is obtained in a known manner from the ratio of the two measured powers $P_{DUT}$, $P_{REF}$.

For precise impedance measurements, it is necessary initially to obtain three correction parameters—source-port matching ($e_s$), directivity ($e_d$) and reflection synchronism ($e_r$) within the framework of a calibration of the VNA with appropriate impedance standards. With their help, the ratio of the waves a and b can be calculated with a relatively higher accuracy from the mappings a' and b'. In order to increase the accuracy of the power calibration, the measurement errors resulting from mismatching must first be corrected. For this purpose, the complex source-reflection coefficient ($\Gamma_{eq}$) is required for the power calibration alongside the complex reflection coefficients of the reference power sensor 4 and of the power sensor 2 to be calibrated, both of which can be determined via the impedance measurement at the test port. Accordingly, it is desirable if $\Gamma_{eq}$ is identical to the source-reflection coefficient ($e_s$), which is determined within the framework of the impedance calibration of the VNA. With the present structure (FIG. 4), the following applies $\Gamma_{eq} \neq e_s$.

With the use of vectorial network analyzers as the calibration system for power sensors, it is also disadvantageous if the signal generators in the vectorial network analyzers do not generally provide long-term stability.

Figure 5:
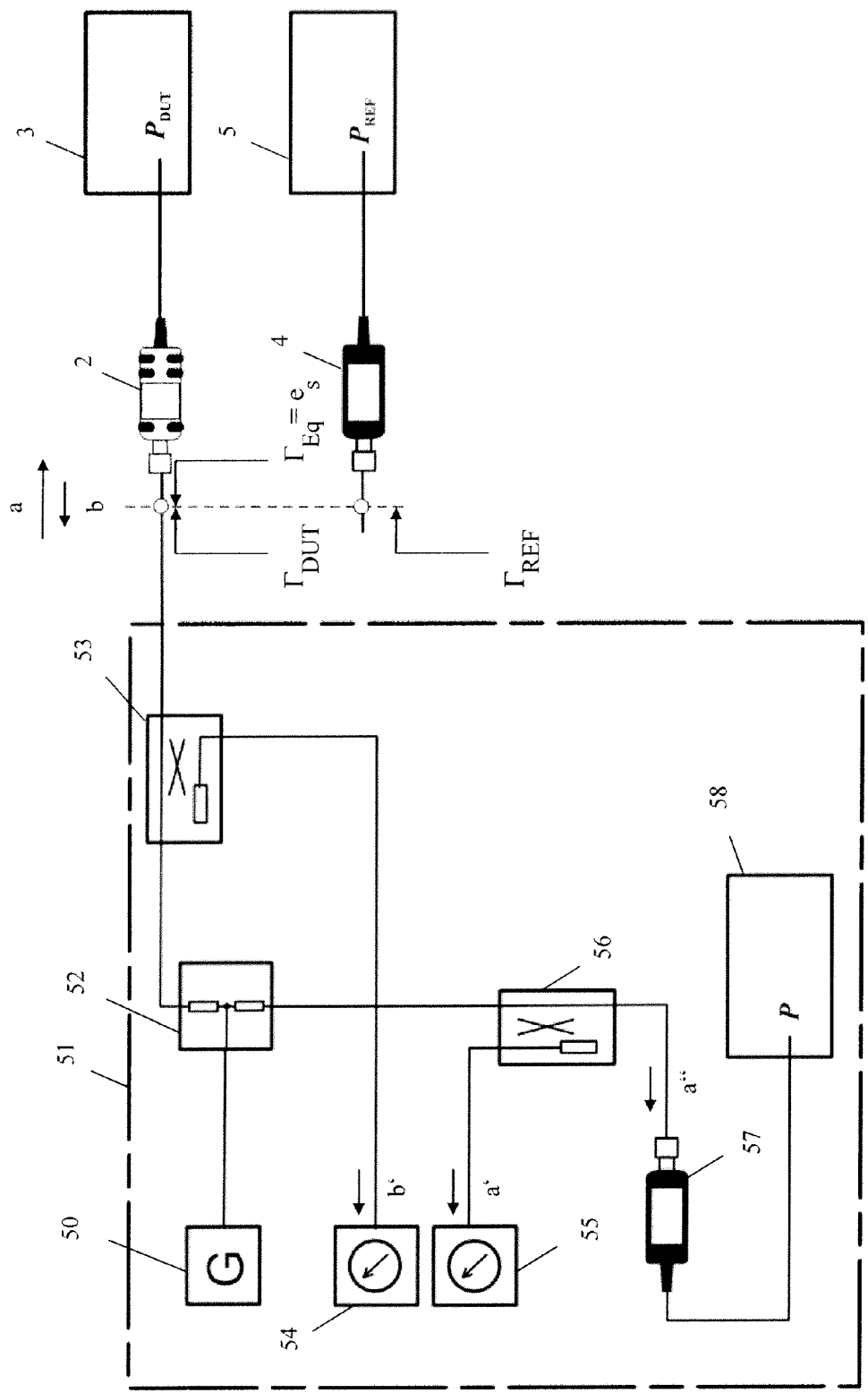
FIG. 5 shows a first exemplary embodiment of the calibration system according to the invention.

FIG. 5 shows a first exemplary embodiment of the calibration system according to the invention. The calibration system 51 contains a signal generator 50 that is connected to a power splitter 52. The first output of the power splitter 52 is connected to the test port of the calibration system 51. A directional coupler 53 is connected between the output of the power splitter 52 and the test port.

The second output of the power splitter 52 is connected to an internal power sensor 57. A directional coupler 56 is arranged between the second output of the power splitter 52 and the power sensor 57. The directional coupler 56 decouples a signal a' which largely corresponds to the signal a output at the test port and to the signal a" measured at the power sensor 57. The directional coupler 53 decouples a signal b' which largely corresponds to a signal b reflected from the connected power sensor. The signal b' is measured from a first measuring point 54. The signal a' is measured from a second measuring point 55. These are measuring points 54, 55 to be measured in a vectorial manner as they are also used in vectorial network analyzers. The power sensor 57 converts the power of the signal a". This is measured by the power meter 58. In this exemplary embodiment also, as in the case of FIGS. 2-4, a regulating loop to the signal generator 50 can also be used. The calibration system 51 fulfils the requirement for identity between the two complex reflection coefficients $\Gamma_{eq}$ and $e_s$ because it is guaranteed by the circuit topology that the ratio a'/a" is independent of the matching of the power sensor $\Gamma_{DUT}$ and respectively $\Gamma_{REF}$. Moreover, through the integrated power sensor 57, it provides long-term stability. Accordingly, a connection of the reference is not necessary for every measurement. In this example, both the directional coupler 53, 56 and also the power splitter 52 operate as signal splitters.

The calibration system 51 can be used up to approximately 18 GHz. With higher frequencies, the problem occurs that the poor matching of the signal splitter 52, provided anyway within this frequency range, is further impaired by the directional coupler 53 arranged between the power splitter 52 and the test port. This means that the residual errors remaining after the vectorial power correction are still so large that they are detectable in a disturbing manner.

Figure 6:
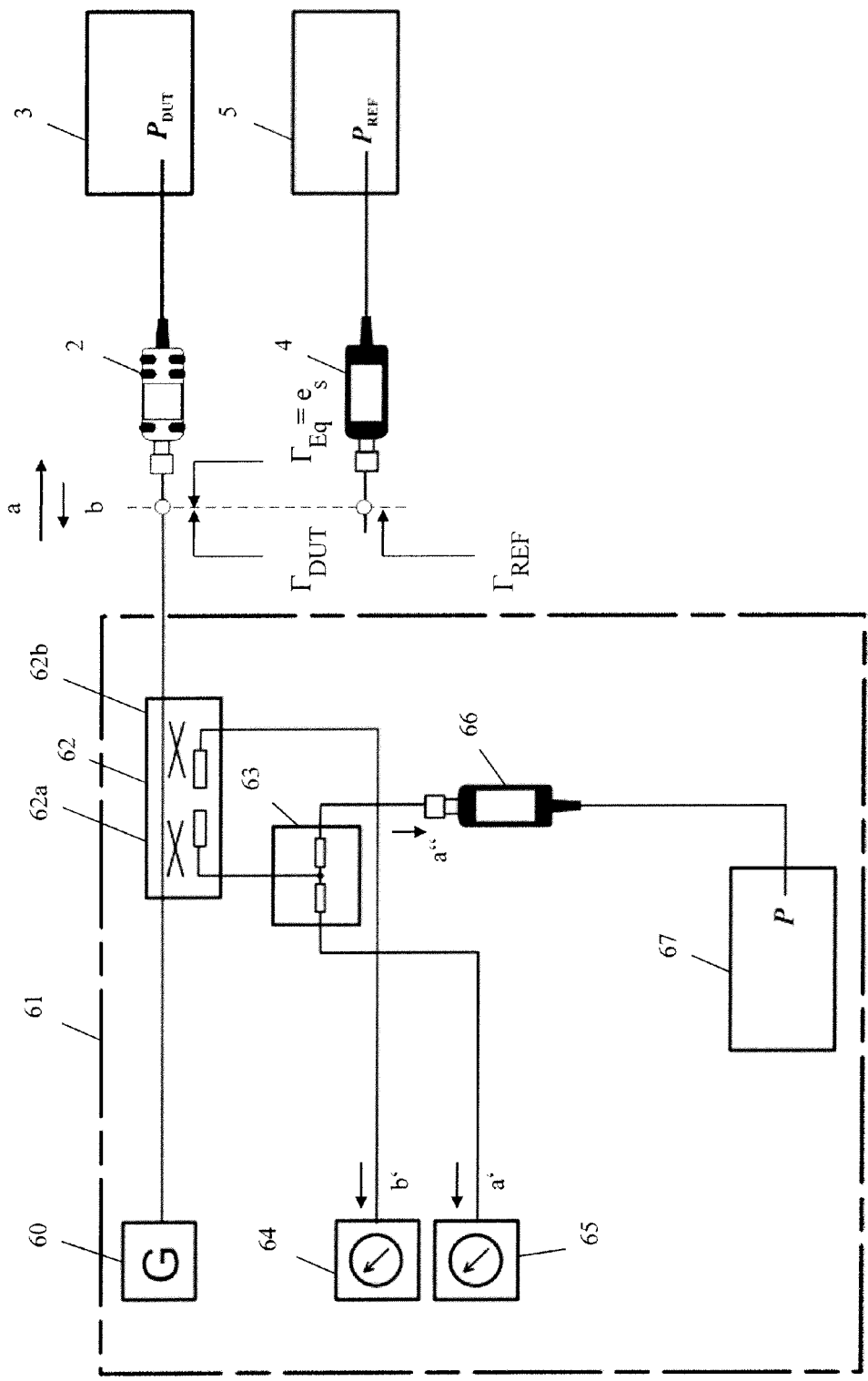
FIG. 6 shows a second exemplary embodiment of the calibration system according to the invention.

The calibration system 51 shown in FIG. 5 accordingly provides a restricted frequency range. In FIG. 6, a second exemplary embodiment of the calibration system for relatively higher frequencies is presented. In order to avoid the unfavorable properties of the calibration system presented in FIG. 5 in this frequency range, the power splitter 52 has been removed. The signal a emitted by the calibration system 61 is decoupled via a double directional coupler 62. The calibration system 61 contains a signal generator 60, which is connected to the double directional coupler 62. The double directional coupler 62 is connected in turn to the test port of the calibration system 61. As in the case of FIGS. 1-5, the power sensor 2 to be tested or respectively the reference power sensor 4 is connected to the test port.

The double directional coupler 62 comprises the two directional couplers 62a and 62b. The coupling branch of the directional coupler 62b in this context is connected to a first measuring point 64. The coupling branch of the directional coupler 62a is connected to an input of a power splitter 63. As an alternative, a directional coupler can also be used here. A first output of the power splitter 63 is connected in this context to a second measuring point 65. A second output of the power splitter 63 is connected to a power sensor 66. The power sensor 66 is connected to a power meter 67. A regulating loop can also be used between the power meter 67 and the signal generator 60. The directional coupler 62a, 62b and also the power splitter 63 operate as signal splitters.

The power generator 60 outputs a signal. The signal is transmitted by the directional coupler 62 to the test port and accordingly to the power sensor 2 to be tested or respectively to the reference power sensor 4. The directional coupler 62a here decouples a signal which corresponds largely to the signal a output at the test port. The power splitter 63 distributes this signal to the second measuring point 65 and the power sensor 66. The second measuring point 65 measures the signal a', while the power sensor 66 converts the signal a". The converted signal a" is measured by the power meter 67. The directional coupler 62b decouples a signal b', which largely corresponds to the signal b reflected from the power meter 2 to be tested or respectively from the reference power sensor 4. This signal is guided to the first measuring point 64 and measured by the latter. As in FIG. 5, the measuring points 64, 65 are vectorial measuring points such as those used in vectorial network analyzers. The circuit topology guarantees that the ratio a'/a" is independent from the matching of the power sensor $\Gamma_{DUT}$ or respectively $\Gamma_{REF}$. Accordingly, $\Gamma_{eq} = e_s$ applies.

In addition to the advantage of a high upper frequency limit, for example, 70 GHz, the calibration system 61 now has the major disadvantage that, below approximately 1 GHz, no power calibrations are possible. This is because the coupling attenuation of the double directional coupler (reflectometer) 62 rises steeply below the named frequency limit and accordingly, the power measurement range of the power sensor 66 is very rapidly left. The functionality of the vectorial network analyzer generally continues to be provided because the test receivers used provide a dynamic range, which is disposed several orders of magnitude above that of power sensors.

Figure 7:
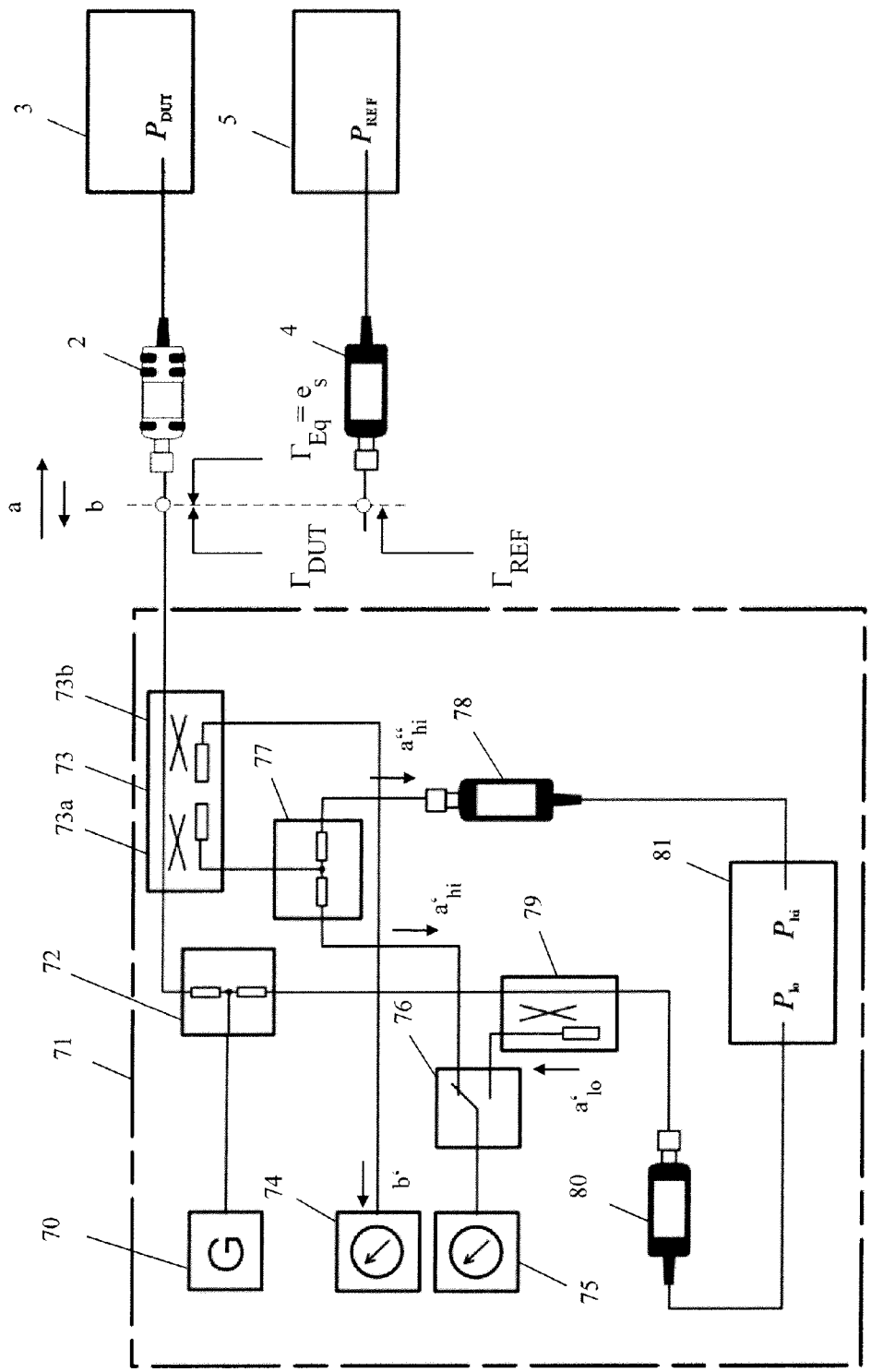
FIG. 7 shows a third exemplary embodiment of the calibration system according to the invention.
Figure 8:
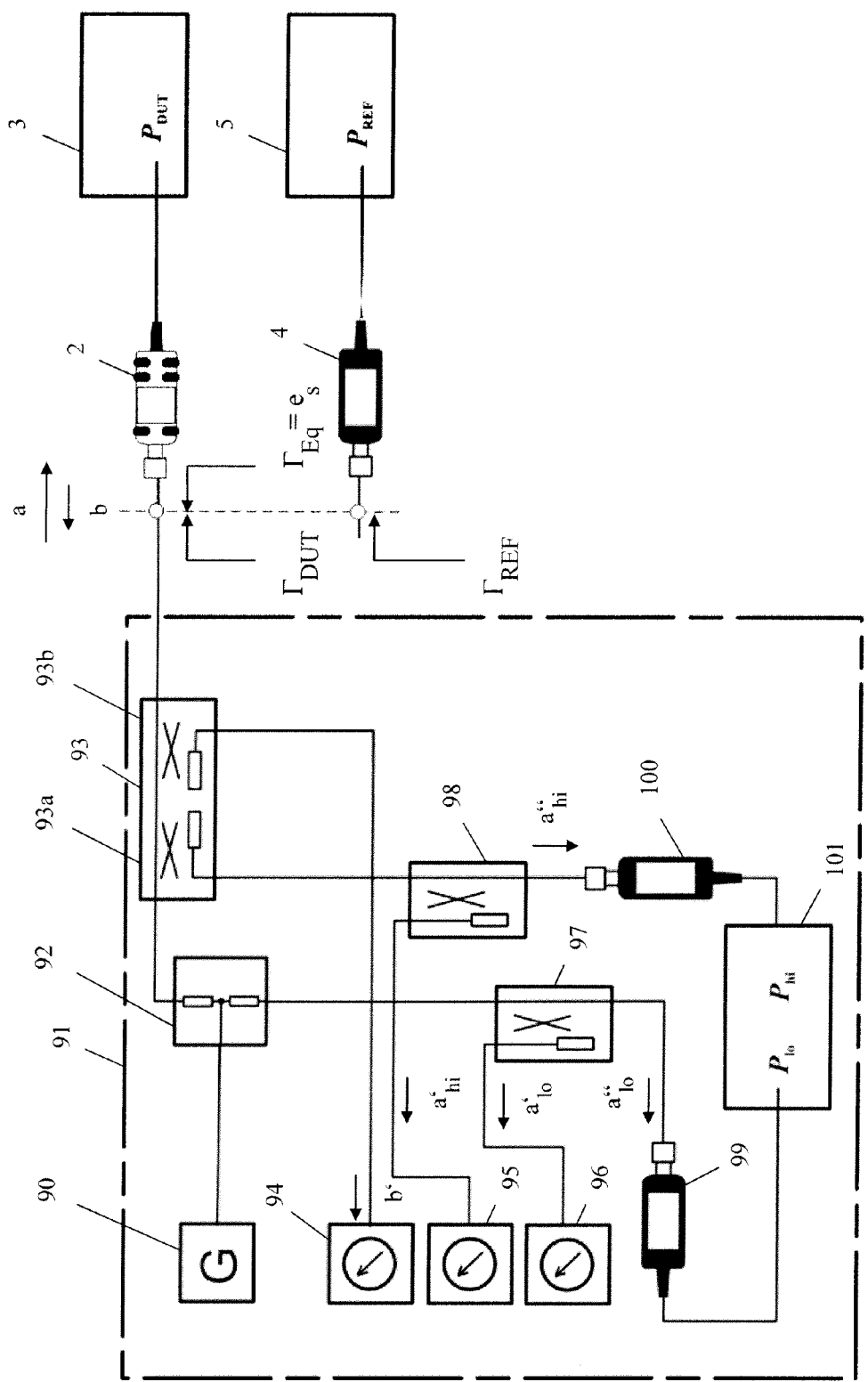
FIG. 8 shows a fourth exemplary embodiment of the calibration system according to the invention.

The calibration system illustrated in FIG. 5 therefore provides favorable properties at low frequencies, while the calibration system illustrated in FIG. 6 provides favorable properties at high frequencies. FIG. 7 shows a third exemplary embodiment of the calibration system according to the invention, which combines the favorable properties of the calibration systems from FIG. 5 and FIG. 6. The calibration system 71 provides a signal generator 70, which is connected to a first power splitter 72. A first output of the power splitter 72 in this context is connected via a double directional coupler 73 to the test port of the calibration system 71. As also in FIGS. 1-6, the power sensor 2 to be calibrated and respectively the reference power sensor 4 is connected to the test port. An internal power sensor 80 is connected via a directional coupler 79 to the second output of the power splitter 72.

The double directional coupler 73 comprises the directional couplers 73a and 73b. The coupling branch of the directional coupler 73b is connected to a first vectorial measuring point 74. The coupling branch of the directional coupler 73a is connected to the input of a second power splitter 77. A first output of the power splitter 77 is connected to a second internal power sensor 78. The power sensors 78, 80 are connected to the power meter 81. Here also, a regulating loop to the signal generator 70 can be used. The second output of the power splitter 77 is connected via a switch 76 to a second vectorial measuring point 75. The coupling branch of the directional coupler 79 is also connected via the switch 76 to the second vectorial measuring point 75. The directional couplers 73, 79 and the power splitters 72, 77 are signal splitters.

The signal generator 70 outputs a signal, which is subdivided by the signal splitter 72. A first part of the signal is guided by the double directional coupler 73 to the test port. The second part of the signal is guided by the directional coupler 79 to the power sensor 80 ($a_{lo}$") and converted by the latter. The power meter 81 measures the power of the converted signal. The directional coupler 73b decouples a signal b' which corresponds largely to a signal b reflected respectively from the power sensor 2 to be tested or the reference power sensor 4 and guides it to the first vectorial measuring point 74. This measures the signal. The directional coupler 73a decouples a signal which corresponds largely to the signal a output at the test port. The power splitter 77 (possibly a directional coupler) splits the decoupled signal of the directional coupler 73a into two paths. At its first output, it outputs a signal $a_{hi}$" to the power sensor 78. The power sensor 78 converts the signal $a_{hi}$" and reroutes it to the power meter 81. This measures the signal. At its second output, the power splitter 77 outputs a signal $a'_{hi}$ and guides it via the switch 76 to the second measuring point 75. The coupling branch of the directional coupler 79 decouples a signal $a'_{lo}$ and guides it, also via the switch 76, to the second measuring point 75.

If the signal generator 70 outputs a low-frequency signal, for example <19 GHz, this is transmitted via the power splitter 72 to the directional coupler 79. The power of the signal is determined by the power sensor 80 and the power meter 81. The switch 76 is in the lower switch position. The signal $a'_{lo}$ is measured from the second measuring point 75. The measured result from the power sensor 78 is rejected.

By contrast, if the signal generator 70 outputs a high-frequency signal, for example >19 GHz, the switch 76 is disposed in the upper switch position illustrated here. The second measuring point 75 accordingly measures the signal $a'_{hi}$, which is decoupled by the directional coupler 73a. The power of the signal $a_{hi}$" is determined by the power sensor 78 and the power meter 81. The measured result of the power sensor 80 is rejected.

However, the switch used can cause a low long-term stability. These difficulties can be avoided with the fourth exemplary embodiment of the calibration system according to the invention. The calibration system 91 corresponds largely to the calibration system 71 from FIG. 7. Only significant differences will be described here. The double directional coupler 93 corresponds to the double directional coupler 73 from FIG. 7. The coupling branch of the directional coupler 93a here is connected to a directional coupler 98 instead of the power splitter 77 from FIG. 7. The signal $a"_{hi}$ is rerouted by the directional coupler 98 to the power sensor 100, which corresponds to the power sensor 78 from FIG. 7. The coupling branch of the directional coupler 98 decouples a signal $a'_{hi}$ and reroutes it to a third measuring point 95. This is a vectorial measuring point. The signal is measured from this measuring point 95 in a vectorial manner. A switch 76 from FIG. 7 is not required in this exemplary embodiment. The directional couplers 93, 97, 98 and also the power splitter 92 are signal splitters.

The coupler output of the directional coupler 97, which corresponds to the directional coupler 79 from FIG. 7, is connected here directly to the second measuring point 96, which corresponds to the second measuring point 75 from FIG. 7. The second measuring point 96 therefore measures the signal $a'_{lo}$ continuously.

Accordingly, if the signal generator 90 outputs a low-frequency signal, for example, <19 GHz, the power of the signal is measured by the power sensor 99 and the power meter 101. At the same time, the signal $a'_{lo}$ is measured by the measuring point 96. The measured result of the vectorial measuring point 95 and the measured result of the power sensor 100 are rejected in this case.

By contrast, if a high frequency signal, for example, >19 GHz is output by the signal generator 90, the power of the signal is measured by the power sensor 100 and the power meter 101, while the signal $a'_{hi}$ is measured by the third vectorial measuring point 95.

In this case, the measured results of the second measuring point 96 and of the power sensor 99 are rejected.

The function of the calibration systems presented on the basis of FIGS. 5 to 8 will be described with reference to the following equations:

Power calibration of the system:

Let $K_{sys}(f)$ be the power calibration factor of the system with the frequency f; $P_{REF}(f)$ the power of the wave a(f) emitted at the test port, measured by the reference power meter; and P(f) the power measured by the internal power sensor. Starting from the definition:

$$K_{sys}(f) = \frac{P(f)}{|a(f)|^2} \quad (4)$$

for the case $\gamma_{DUT}=0$ or respectively $\gamma_{REF}=0$, the power calibration factor for the calibration of the system with the reference power sensor can be calculated as follows:

$$K_{sys}(f) = \frac{P(f)}{P_{REF}(f)} \cdot \frac{1}{|1 - e_s(f) \cdot \Gamma_{REF}(f)|^2} \quad (5)$$

Power calibration of a device under test:

For the calibration of a device under test, the buffered power calibration factor $K_{sys}(f)$ is accessed in order to calculate the power $|a(f)|^2$ from the power P(f) of the internal power sensor, which impinges on the device under test:

$$|a(f)|^2 = \frac{P_{DUT}}{K} = \frac{P(f)}{K_{sys}(f)} \cdot \frac{1}{|1 - e_s(f) \cdot \Gamma_{DUT}(f)|^2} \quad (6)$$

With regard to the calibration factor of the device under test, the following therefore applies:

$$K(f) = \frac{P_{DUT}(f)}{P(f)} K_{sys}(f) \cdot |1 - e_s(f) \cdot \Gamma_{DUT}(f)|^2 \quad (7)$$

The source-port matching $e_s$ is obtained through an impedance calibration of the network analyzer at the test port using standard methods (for example, open short match). The reflection coefficients $\Gamma_{DUT}$ and respectively $\Gamma_{REF}$ are obtained with the impedance-calibrated network analyzer with an evaluation of the test parameters a' and b'.

The invention is not restricted to the exemplary embodiment presented. As already mentioned, different signal splitters can be used. All of the features described above or shown in the figures can be combined with one another as required within the framework of the invention.

What is claimed is:

1. A calibration system for calibrating power sensors comprising a signal generator, a first signal splitter, a second signal splitter, a third signal splitter, a first measuring point, a second measuring point, a test port and a first power sensor, wherein:
   the signal generator is connected to an input of the first signal splitter,
   a first output of the first signal splitter is connected to the second signal splitter,
   a first output of the second signal splitter is connected to the test port,
   a second output of the second signal splitter is connected to the first measuring point,
   a second output of the first signal splitter is connected to the third signal splitter,
   a first output of the third signal splitter is connected to the first power sensor, and
   a second output of the third signal splitter is connected to the second measuring point.

2. The calibration system according to claim 1, wherein:
   the first measuring point measures a signal (b') that corresponds largely to a signal (b) returning from the test port, and
   the second measuring point measures a signal (a', a'$_{hi}$, a'$_{lo}$) that corresponds largely to a signal (a) output at the test port.

3. The calibration system according to claim 1, wherein:
   the first signal splitter is a power splitter,
   the second signal splitter is a directional coupler,
   the second output of the second signal splitter is a coupling branch,
   the third signal splitter is a directional coupler, and
   the second output of the third signal splitter is a coupling branch.

4. The calibration system according to claim 1, wherein:
   the first signal splitter is a directional coupler,
   the second output of the first signal splitter is a coupling path,
   the second signal splitter is a directional coupler,
   the second output of the second signal splitter is a coupling path, and
   the first signal splitter is a power splitter or a directional coupler.

5. The calibration system according to claim 4, wherein the third signal splitter is a directional coupler.

6. The calibration system according to claim 4, wherein the first signal splitter and the second signal splitter are embodied as a common double directional coupler.

7. The calibration system according to claim 6, wherein the third signal splitter is a directional coupler.

8. The calibration system according to claim 1, wherein:
   the first output of the first signal splitter is connected to a fourth signal splitter,
   a first output of the fourth signal splitter is connected to the second signal splitter, and
   the second signal splitter is connected to the first signal splitter only by means of the fourth signal splitter.

9. The calibration system according to claim 8, wherein the fourth signal splitter is a directional coupler.

10. The calibration system according to claim 8, wherein:
    a second output of the fourth signal splitter is connected to a fifth signal splitter, and
    the first output of the fifth signal splitter is connected to a second power sensor.

11. The calibration system according to claim 10, wherein:
    when a high-frequency signal is generated by the signal generator, a signal (a"$_{hi}$) that corresponds largely to a signal (a) output at the test port, is disposed at a second output of the fifth signal splitter,
    when a high-frequency signal is generated by the signal generator, no usable signal is disposed at the second output of the third signal splitter,
    when a low-frequency signal is generated by the signal generator, no usable signal is disposed at the second output of the fifth signal splitter, and
    when a low-frequency signal is generated by the signal generator, a signal (a'$_{lo}$) that corresponds largely to a signal (a) output at the test port, is disposed at the second output of the third signal splitter.

12. The calibration system according to claim 10, wherein:
    a second output of the fifth signal splitter is connected via a switch to the second measuring point,
    the second output of the third signal splitter is connected via the switch to the second measuring point, and
    the switch switches the second measuring point between the second output of the fifth signal splitter and the second output of the third signal splitter.

13. The calibration system according to claim 10, wherein a second output of the fifth signal splitter is connected to a third measuring point.

14. The calibration system according to claim 10, wherein the fifth signal splitter is a directional coupler or a power splitter.

15. A method for power calibration and measurement of the source-port matching by the calibration system according to claim 1, comprising using an impedance value obtained through a measurement of the source-port matching for a correction of a power calibration.

* * * * *